US009894767B1

United States Patent
Krugman

(10) Patent No.: US 9,894,767 B1
(45) Date of Patent: Feb. 13, 2018

(54) CONCENTRIC CIRCLE PRINTED CIRCUIT BOARD ELECTRICAL CONNECTION

(71) Applicant: Jason Krugman Products, LLC, Long Island, NY (US)

(72) Inventor: Jason Krugman, Long Island, NY (US)

(73) Assignee: Jason Krugman Products, LLC, Long Island City, NY (US)

( * ) Notice: Subject to any disclaimer, the term of this patent is extended or adjusted under 35 U.S.C. 154(b) by 0 days.

(21) Appl. No.: 15/460,178

(22) Filed: Mar. 15, 2017

Related U.S. Application Data

(60) Provisional application No. 62/310,749, filed on Mar. 20, 2016.

(51) Int. Cl.

| | |
|---|---|
| *H05K 1/14* | (2006.01) |
| *H05K 1/11* | (2006.01) |
| *H05K 1/18* | (2006.01) |
| *H01R 35/04* | (2006.01) |
| *H01R 12/71* | (2011.01) |

(52) U.S. Cl.
CPC .......... *H05K 1/144* (2013.01); *H01R 12/714* (2013.01); *H01R 35/04* (2013.01); *H05K 1/115* (2013.01); *H05K 1/181* (2013.01); *H05K 2201/09036* (2013.01); *H05K 2201/09227* (2013.01); *H05K 2201/10106* (2013.01)

(58) Field of Classification Search
USPC ......................................... 361/790, 785, 735
See application file for complete search history.

(56) References Cited

U.S. PATENT DOCUMENTS

| | | | |
|---|---|---|---|
| 6,768,233 B2 | 7/2004 | Angerpointner | |
| 6,984,915 B2 | 1/2006 | Galyean | |
| 7,142,071 B2 | 11/2006 | Coleman | |
| 2004/0053483 A1* | 3/2004 | Nair | H01L 21/2885 438/540 |
| 2010/0212948 A1* | 8/2010 | Lin | H01L 21/563 174/261 |
| 2015/0295376 A1 | 10/2015 | Ott et al. | |

* cited by examiner

*Primary Examiner* — Andargie M Aychillhum
(74) *Attorney, Agent, or Firm* — Bond Schoeneck & King, PLLC; George McGuire

(57) ABSTRACT

A design for conductive pads and electrical traces on the surface and within a printed circuit board allowing multiple boards of similar or identical design to be stacked upon one another such that they are electrically coupled. The design allows for multiple electrically isolated conductor paths to be electrically coupled amongst multiple printed circuit boards. It also allows the printed circuit boards to be positioned with rotating orientation to one another.

18 Claims, 14 Drawing Sheets

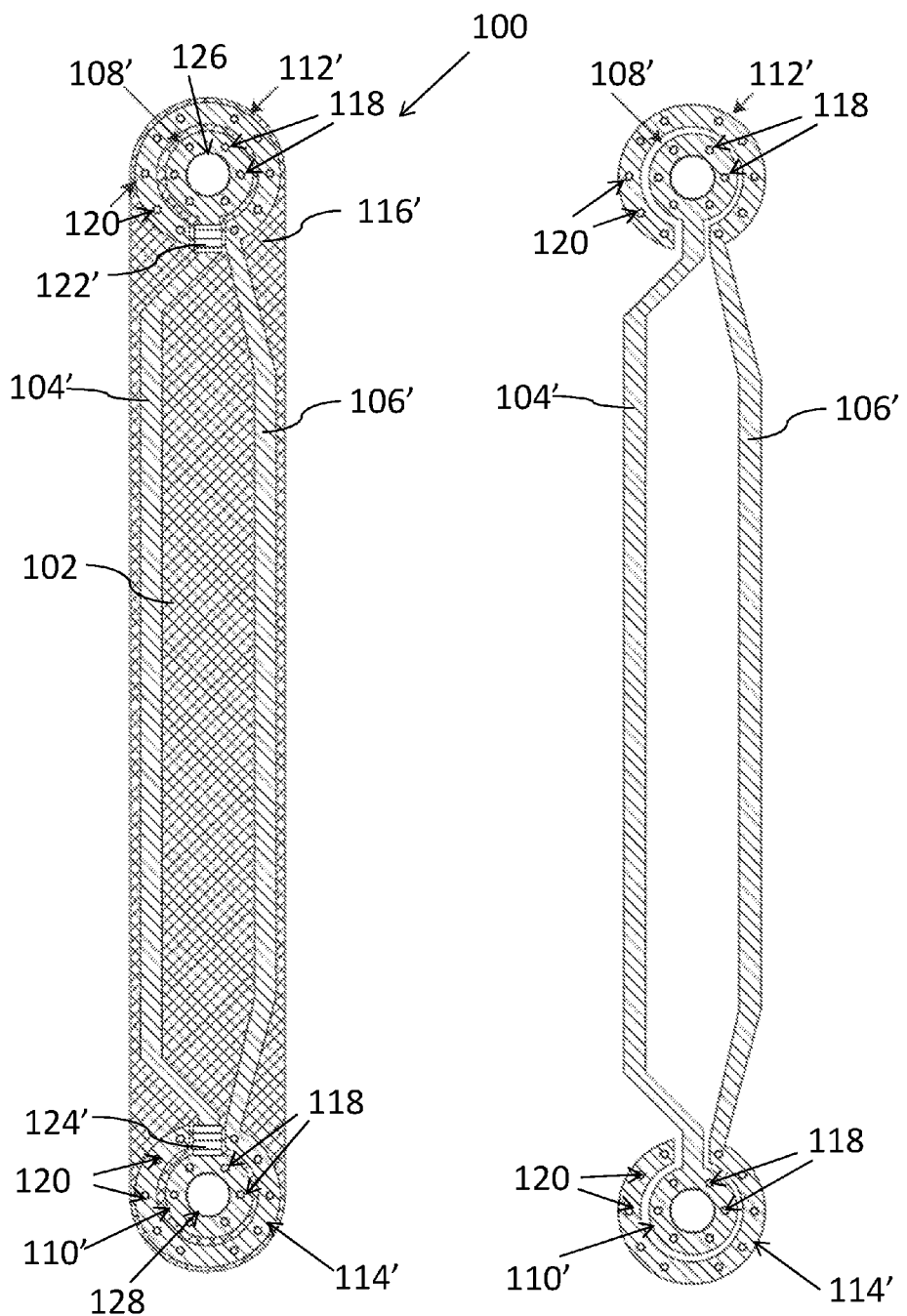

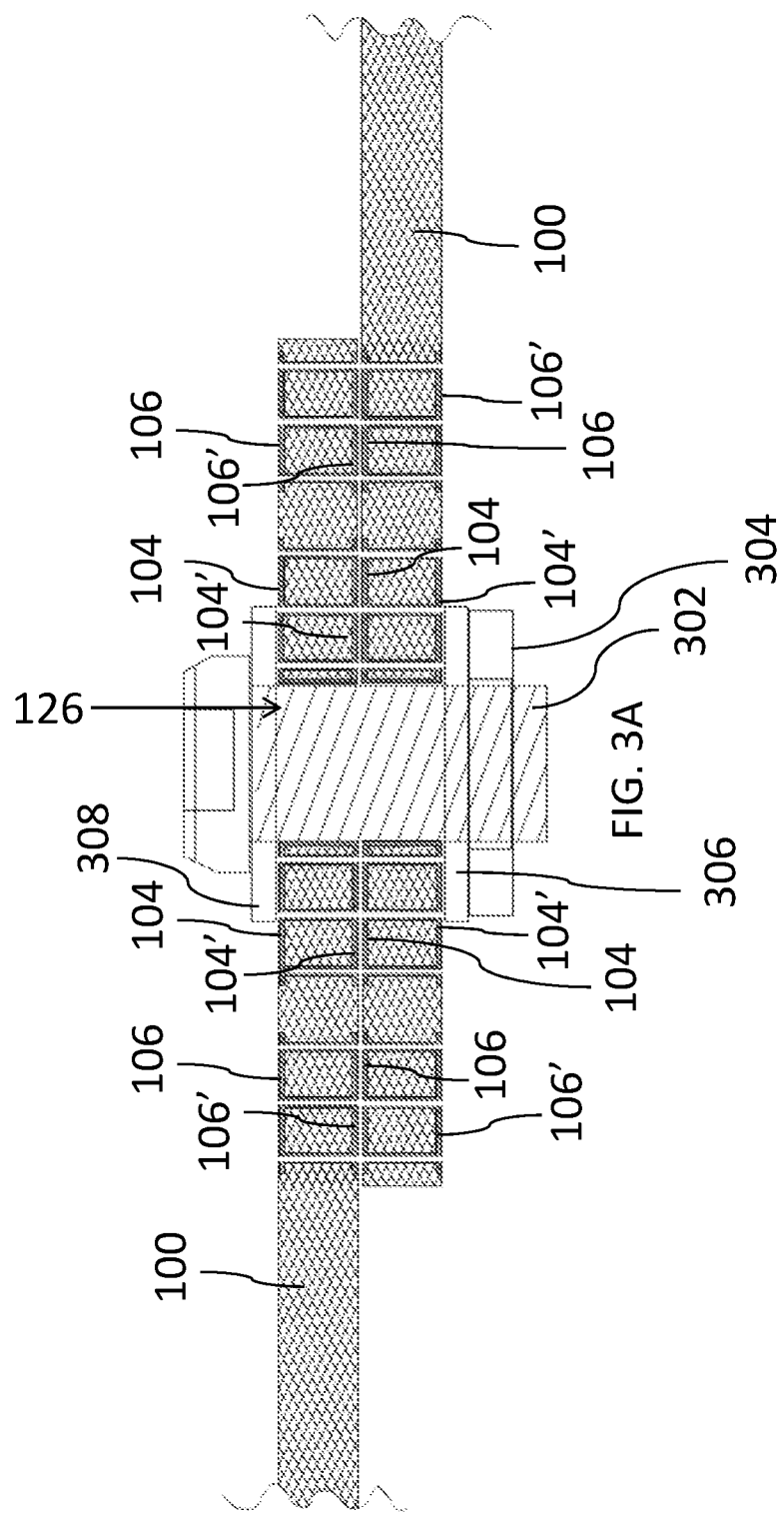

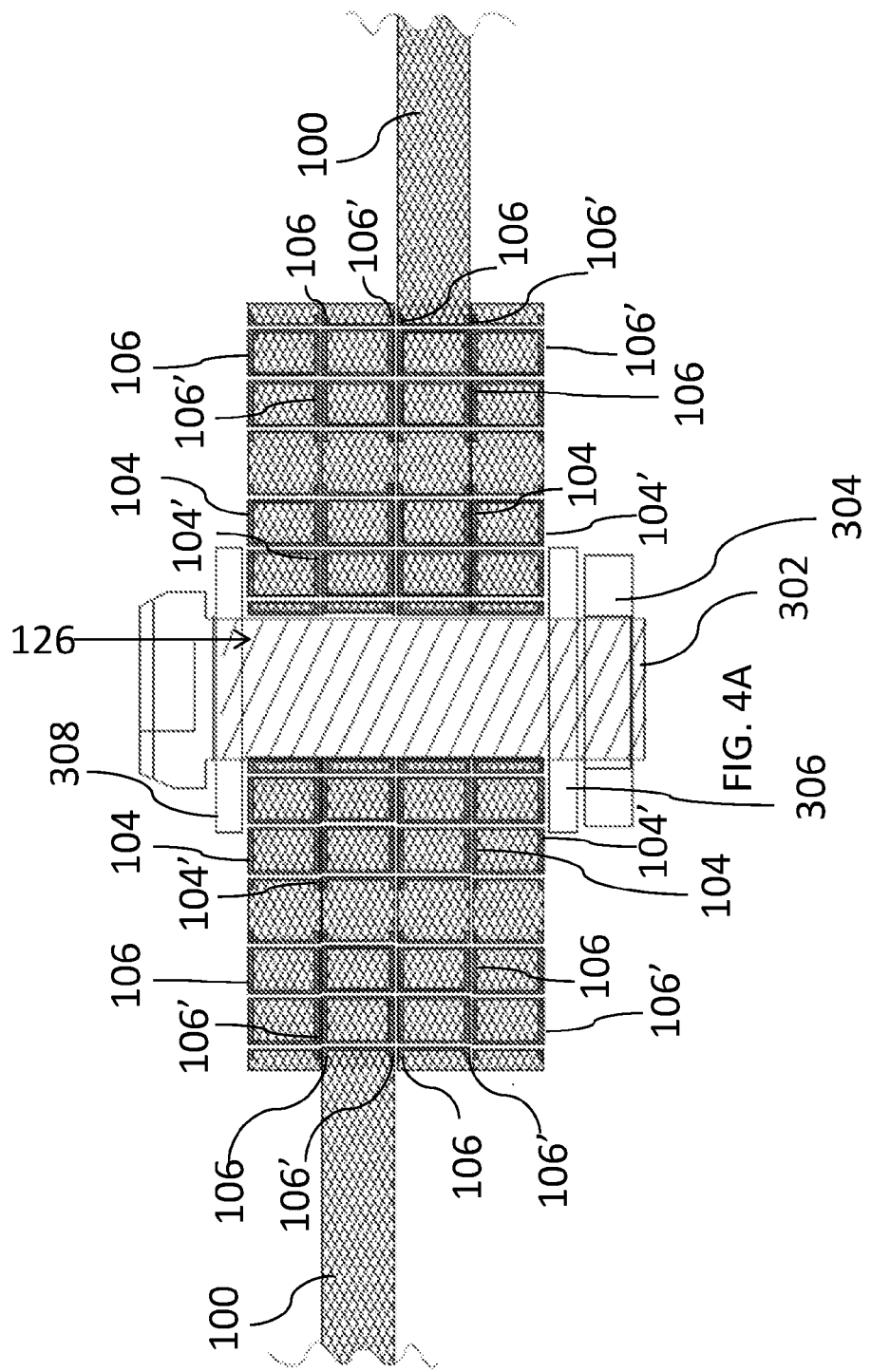

CONCENTRIC CIRCLE PRINTED CIRCUIT BOARD ELECTRICAL CONNECTION

CROSS-REFERENCE TO RELATED APPLICATION

This application claims priority to U.S. Provisional Patent Application Ser. No. 62/310,749, filed on Mar. 20, 2016 and entitled "Concentric Circle Printed Circuit Board Electrical Connection," the entire disclosure of which is incorporated herein by reference.

FIELD OF THE INVENTION

The invention relates generally to a way of electrically and mechanically connecting printed circuit boards to one another.

BACKGROUND

The Printed Circuit Board ("PCB") is the standard for precisely controlling the layout of electrical conductors, components and electro-mechanical connectors within two and three-dimensional space. The PCB allows for the creation of a network of parts and conductors in a wide variety of orientations and has been used in countless electrical products for many years.

The PCB is essentially the fundamental building block for distributing electricity within physical space. While many designs do not require more than a single PCB to achieve their intended goals, it is necessary in some circumstances to utilize more than a single PCB to create a particular physical arrangement of electricity, electrical components and materials within space. When two or more PCBs are used to comprise a single electrical circuit, it is often necessary to electrically couple multiple isolated electrical regions between PCBs.

Previous designs have featured a myriad of electrical connectors that can be soldered to the PCBs. PCBs are coupled—electrically, mechanically or both—by connectors. Screw terminals, terminal blocks, and male/female socket connections are amongst the standard connector types. The most basic way of connecting two PCBs together is to solder one or more conductor to each PCB. The PCBs can also be connected to each other by mechanically attaching one or more shared conductor to both by wrapping a conductive wire or material around a screw, post, crimp or other physical element that is itself electrically and mechanically attached to the PCB. Bus bars (usually a solid piece of conductive material) are also used to attach multiple PCBs together by screwing the PCBs to it or vice versa.

In designing different electrical connectors, the primary considerations are the size of the mechanical junction (the overall surface area on a molecular scale) and the conductivity of the surface in contact. When joining two relatively rigid elements (such as two PCBs) in a way that allows the two elements to move with respect to each other, prior approaches have relied upon spring pins, wiping mechanical elements such as brushes or graphite contacts backed by springs, or plug and socket type connections, where one part of the connector fits inside another. Many of these designs utilize a springing action as well to maintain surface area in spite of mechanical variability (vibration).

All of these methods have their strengths and weaknesses. Some of them are more sturdy and reliable than others, some of them are permanent, others removable. These methods and designs, however, do not provide an easy way of allowing two PCBs or more to be movable between different orientations with respect to one another while remaining in electrical contact in a variety of orientations. In fact, many of these designs only permit the connection of two circuit boards in a single orientation (i.e. fixed with respect to each other). Other designs that do permit the circuit boards to adopt different positions with respect to one another are complex and expensive to manufacture and assemble. Accordingly, there is a need in the art for a simple, efficient, and cost-effective connector that permits two or more printed circuit boards to be electrically connected in wide variety of positions with respect to one another.

SUMMARY OF THE INVENTION

This application discloses a simple, efficient, and cost-effective connector that permits two or more circuit boards to be electrically connected in any position with respect to each other provided they share a single axis of rotation. More specifically, the application relates to a design for conductive pads and electrical traces on the surface and within a printed circuit board allowing multiple boards of similar or identical design to be stacked upon one another such that they are electrically coupled. The design allows for multiple electrically isolated conductor paths to be electrically coupled amongst multiple printed circuit boards. It also allows the printed circuit boards to be positioned with rotating orientation to one another.

An embodiment of the invention is directed to a way of electrically and mechanically coupling two or more PCBs by screwing or pressing them together. With the PCBs overlapping, a screw passing through a hole or a slot in one or both PCBs can function to fasten them together when paired with a nut. An electrical connection is made between a conductive trace or pad on both boards within the overlapping zone. Rivets, magnets, or other fasteners can also achieve this goal of pressing the two PCBs together to form a mechanical connection and bring the exposed conductive regions from each PCB into contact with one another. Since it is often beneficial to share more than one conductive region between two or more PCBs, a method for doing this in a versatile manner is valuable. Allowing PCBs to share multiple mutually exclusive conductive regions without wire or additional physical connectors is the primary goal of this invention. The invention described herein will allow for a multitude of new products and techniques that benefit from its efficiency, reliability and versatility.

According to an aspect, a circuit board comprises: a substrate having a first surface and an opposing second surface; a first circular trace being conductive and disposed on the first surface of the substrate; a second circular trace being conductive and disposed on the first surface of the substrate, wherein the first circular trace and the second circular trace are arranged concentrically and are electrically insulated from each other; a third circular trace being conductive and disposed on the second surface of the substrate, a first via extending through the substrate and contacting the first circular trace and the third circular trace such that an electrical connection is formed between the first circular trace and the third circular trace; a fourth circular trace being conductive and disposed on the second surface of the substrate, wherein the third circular trace and the fourth circular trace are arranged concentrically and are electrically insulated from each other; a second via extending through the substrate and being in electrical contact with the second circular trace and the fourth circular trace, wherein the third circular trace and the fourth circular trace are arranged opposite the first circular trace and the second circular trace, respectively.

According to an embodiment, the substrate defines a through-hole extending through the substrate and sized to receive a fastener, wherein the through-hole is located in the center of the first circular trace, the second circular trace, the third circular trace, and the fourth circular trace.

According to an embodiment, the circuit board further comprises a fastener extending through the through-hole defined by the substrate According to an embodiment, the circuit board further comprises a nylon washer held against the first surface of the substrate by the fastener.

According to an embodiment, the circuit board further comprises a spring washer held against the first surface of the substrate by the fastener.

According to an embodiment, wherein the substrate defines an indentation sized to receive a magnet, wherein the indentation is located in the center of the first circular trace, the second circular trace, the third circular trace, and the fourth circular trace.

According to an embodiment, the circuit board further comprises a fifth circular trace being conductive and arranged in a concentric configuration with the first circular trace and the second circular trace; a sixth circular trace being conductive and arranged in a concentric configuration with the third circular trace and the fourth circular trace.

According to an embodiment, the circuit board further comprises a fifth circular trace being conductive and disposed on a second end of the first surface, a sixth circular trace being conductive and disposed on a second end of the first surface and arranged concentrically with fifth circular trace, wherein the fifth circular trace and the sixth circular trace are electrically insulated from each other.

According to an embodiment, the circuit board further comprises a first circular trace and the fifth circular trace are connected by a first conductive path, wherein the fourth circular trace and the sixth circular trace are connected by a second conductive path.

According to an embodiment, the first conductive path or the second conductive path interrupts the outer circular trace of the first circular trace and the second circular trace such that it forms a continuous conductive path.

According to an embodiment, the first circular trace is electrical communication with a power source such that the first circular trace, the third circular trace, and the fifth circular traces each receive a charge.

According to another aspect a network of interconnected circuit boards, comprises: a plurality of circuit boards, each circuit board including: a substrate having a first surface and an opposing second surface; a first circular trace being conductive and disposed on the first surface of the substrate; a second circular trace being conductive and disposed on the first surface of the substrate, wherein the first circular trace and the second circular trace are arranged concentrically and are electrically insulated from each other, wherein the first circular trace and the second circular trace of a first circuit board of the plurality of circuit boards are in electrical contact with the first circular trace and the second circular trace, respectively, of a second circuit board of the plurality of circuit boards.

According to an embodiment, the first circuit board further comprises: a third circular trace being conductive and disposed on the second surface of the substrate, a first via extending through the substrate and contacting the first circular trace and the third circular trace such that an electrical connection is formed between the first circular trace and the third circular trace; a fourth circular trace being conductive and disposed on the second surface of the substrate, wherein the fourth circular trace and the second circular trace are arranged concentrically and are electrically insulated from each other; a second via extending through the substrate and being in electrical contact with the second circular trace and the fourth circular trace, wherein the third circular trace and the fourth circular trace are arranged opposite the first circular trace and the second circular trace, respectively.

According to an embodiment, the first circular trace and the second circular trace of a third circuit board of the plurality of circuit boards are in electrical contact with the third circular trace and the fourth circular trace, respectively, of the first circuit board of the plurality of circuit boards.

According to an embodiment, at least one circuit board of the plurality of circuit boards includes a light emitting diode in electrical contact with and powered by the first circular trace and the second circular trace.

According to an embodiment, each circuit board defines a through-hole located in the center of the first circular trace and the second circular trace, wherein a fastening element extends through the through-hole each of the first circuit board and the second circuit board.

According to an embodiment, the fastening elements include one or more nylon washers that frictively engages a surface of the fastening element and either the first surface or the second surface of one of the first circuit board or the second circuit board.

According to an embodiment, the fastening elements include one or more spring washers that maintain pressure on a surface of the fastening element and either the first surface or the second surface of one of the first circuit board or the second circuit board.

According to an embodiment, each circuit board of the plurality of circuit boards further includes a third circular trace disposed at a second end of each printed circuit board.

According to an embodiment, the third circular trace is connected to the first circular trace by a conductive path.

BRIEF DESCRIPTION OF THE DRAWINGS

FIG. 1C depicts the opposing face of the printed circuit board module shown in FIG. 1A, according to an embodiment.

FIG. 1D depicts a conductive region as applied to the opposing face of the printed circuit board module shown in FIG. 1C, according to an embodiment.

FIG. 3A depicts stacked printed circuit board modules, according to an embodiment.

FIG. 4A depicts stacked printed circuit board modules, according to an embodiment.

DETAILED DESCRIPTION

Figure 1A:
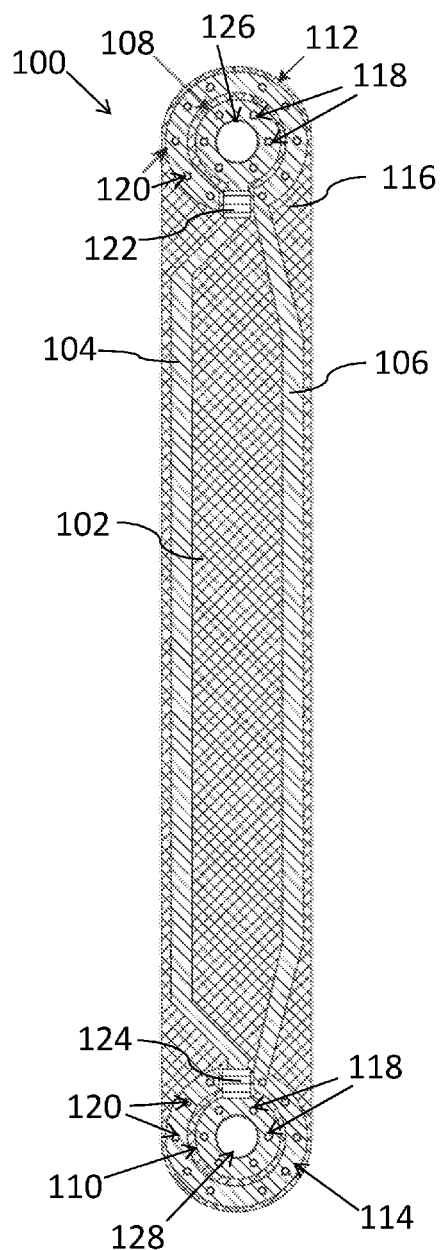
FIG. 1A depicts a printed circuit board module, according to an embodiment.

FIG. 1A shows an embodiment of a PCB module 100. PCB module 100 includes a substrate 102, upon the surface of which several conductive regions 104, 106 are disposed. Each conductive region 104, 106 may define at least one circular trace. For example, conductive region 104 may define circular trace 108 disposed at one end of PCB module 100 and another circular trace 110 disposed at the other end of PCB module 100. Conductive region 106 may similarly define a circular trace 112 disposed at one end of PCB module 100 and another circular trace 114 disposed at the other end of PCB module 100. The circular traces disposed at each end, (e.g, circular traces 108 and 112) may be placed in a concentric configuration, to form concentric rings. These pairs of concentric rings are physically isolated and electrically insulated with respect to one another. Each circular trace of a particular conductive region may be connected together by a conductive path (e.g., the conductive path that runs from circular trace 108 to circular trace 110). According to an embodiment, there is an interruption in the circular form of the outer concentric circular trace, of each set of concentric rings, to allow the conductive region path to pass from within the enclosed circular form of the outer circular trace. Thus, in the example shown in FIG. 1A, there may be an interruption in outer circular trace 112 to permit the conductive region 104 to pass through outer circular trace 112 and to reach inner circular trace 108.

Figure 1B:
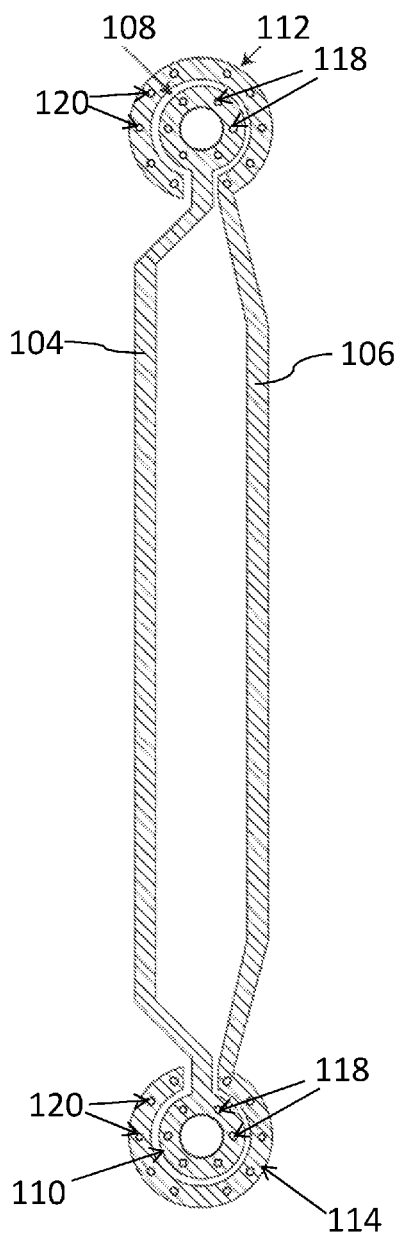
FIG. 1B depicts a conductive region as applied to a printed circuit board module, according to an embodiment.

FIG. 1B depicts conductive regions 104 and 106 removed from substrate 102 and 104. Again, conductive regions 104 and 106 collectively define circular traces at opposing ends. Conductive region 104 defines circular traces 108 and 110, and conductive region 106 defines circular traces 112 and 114.

As shown in FIGS. 1C-1D, the opposing face 116' of PCB module 100 may include another set of conductive regions 104', 106'. These conductive regions may have a similar or identical topology to the conductive regions 104, 106 disposed on the opposite surface 116. Thus, the opposing face 116' of PCB module 100 includes several conductive regions 104', 106' disposed on substrate 102. Each conductive region 104', 106' may define at least one circular trace. For example, conductive region 104' may define circular trace 108' disposed at one end of PCB module 100 and another circular trace 110' disposed at the other end of PCB module 100. Conductive region 106' may similarly define a circular trace 112' disposed at one end of PCB module 100 and another circular trace 114' disposed at the other end of PCB module 100. The circular traces disposed at each end, (e.g, circular traces 108' and 112') may be placed in a concentric configuration, to form concentric rings. These pairs of concentric rings are physically isolated and electrically insulated with respect to one another. Each circular trace of a particular conductive region may be connected together by a conductive path. According to an embodiment, there is an interruption in the circular form of the outer concentric circular trace (e.g., 112' and 114'), of each set of concentric rings, to allow the conductive region path to pass from within the enclosed circular form of the outer circular trace. Thus, in the example shown in FIGS. 1C and 1D, there may be an interruption in outer circular trace 112' to permit the conductive region 104' to pass through outer circular trace 112' and to reach inner circular trace 108'.

One of ordinary skill will appreciate, in conjunction with a review of this disclosure, that there may be some reactive coupling between concentric rings (e.g., between 108 and 112) while still being electrically insulated from one another, as long as the coupling does not interfere with the intended operation of the device.

FIG. 1D depicts conductive regions 104' and 106' removed from substrate 102. Again, conductive regions 104' and 106' collectively define circular traces at opposing ends. Conductive region 104' defines circular traces 108' and 110', and conductive region 106 defines circular traces 112' and 114'.

One of ordinary skill will appreciate, in conjunction with a review of this disclosure, that conductive regions 104' and 106' need not be identical in shape to conductive regions 104 and 106. Rather, it is only necessary that concentric circular traces (e.g., 110' and 114') be dimensioned such the circular traces of one end of PCB module 100 align with the respective circular traces on another PCB module 100 when they are stacked together in a stacked configuration as shown in FIGS. 3A and 4A (discussed below).

Each conductive region 104', 106' of surface 116' may be electrically connected by vias to a corresponding conductive region 104, 106 on the opposing surface 116. For example, conductive region 104' may be connected by vias 118 to conductive region 104 located on surface 116. Similarly, conductive region 106' may be connected by vias 120 to conductive region 106 located on surface 116. (To avoid cluttering the drawings, not all vias have been identified by reference numerals.) In this way, an electric potential, or ground, connected to a particular conductive region may be communicated to the corresponding conductive region on the opposing surface. Thus, if a charge is applied to conductive region 104, conductive region 104' will similarly bear the same charge. If ground is applied to conductive region 106, conductive region 106' will also be grounded. In this way, a potential difference may exist between the conductive regions of each surface. Moreover, an electric potential difference applied to the conductive regions of one surface will exist on the conductive regions of the opposite surface. Furthermore, a charge applied to one circular trace, will similarly exist at all points of the conductive region from which circular trace is defined.

PCB module 100 may further include solder masks 122 and 124, placed in a covering relation with inner circular traces 108 and 110, respectively. Solder masks 122 and 124 prevent a short when circular traces 108, 112 or 110, 114 are placed in contact with the circular traces of another PCB module 100. Solder masks 122' and 124' may similarly be used on the opposing face for inner traces 108' and 110', respectively.

In an alternate embodiment, conductive regions 104, 106, 104', 106' (or any combination of those) may be vias and conductive traces that pass within inner layers of substrate 102 and thus do not require an interruption in each outer circular (112, 114, 112', or 114') trace to connect to each inner circular trace (108, 110, 108', 110').

As described further below, in different embodiments, in the center of each set of circular traces, PCB module 100 may define a through-hole 126, 128 for a mechanical fastener to pass through the entire PCB module 100 and to connect one or more PCB modules 100. In an alternate embodiment, PCB module 100 may include an indentation for receiving a magnetic module that may in the indentation and retain another PCB module that similarly includes a magnetic connector.

Figure 1E:
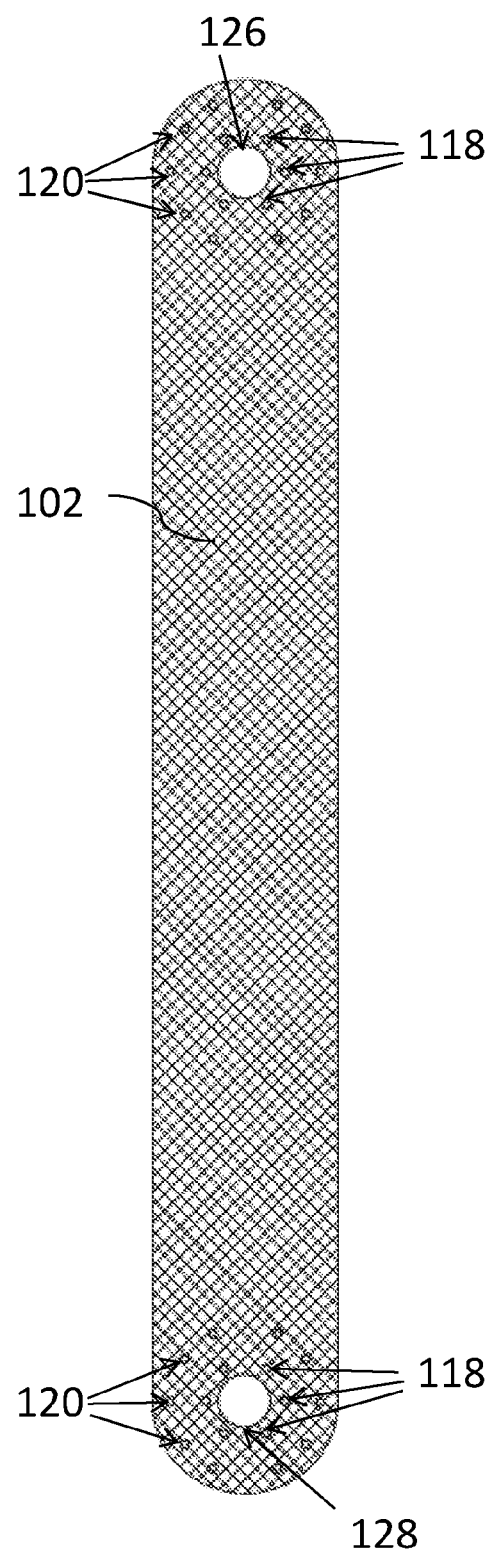
FIG. 1E depicts a substrate of a printed circuit board module, according to an embodiment.

FIG. 1E depicts substrate 102 without conductive regions 104, 106 or 104', 106'. Substrate 102 includes vias 34, 36, which extend through substrate 102 to each surface 118, 120. Vias 118, 120 may be comprised of metal-plated through-holes to permit the transmission of a voltage. However, vias 118, 120 may alternately be fashioned according to any method known in the art for creating a via that is suitable for the functions required in this application. Substrate also defines through-holes 126 and 128.

As shown, PCB module 100 may be a flat-sided oval (also known as a stadium). In alternate embodiments, PCB module 100 may be any other geometric shape fashionable out of a PCB substrate. For example, PCB module 100 may be a polygonal shape such as a rectangle or rhombus. In each of these embodiments, the circular trace may be positioned on the PCB module 100 at any point advantageous for connecting to another PCB module 100. For example, in one embodiment, PCB module 100 may be star shaped and include a pair of concentric circular traces disposed at the end of each arm of the star. In another example, PCB 10 module may be square shaped and include a pair of concentric circular traces at each corner.

Figures 2A, 2B:
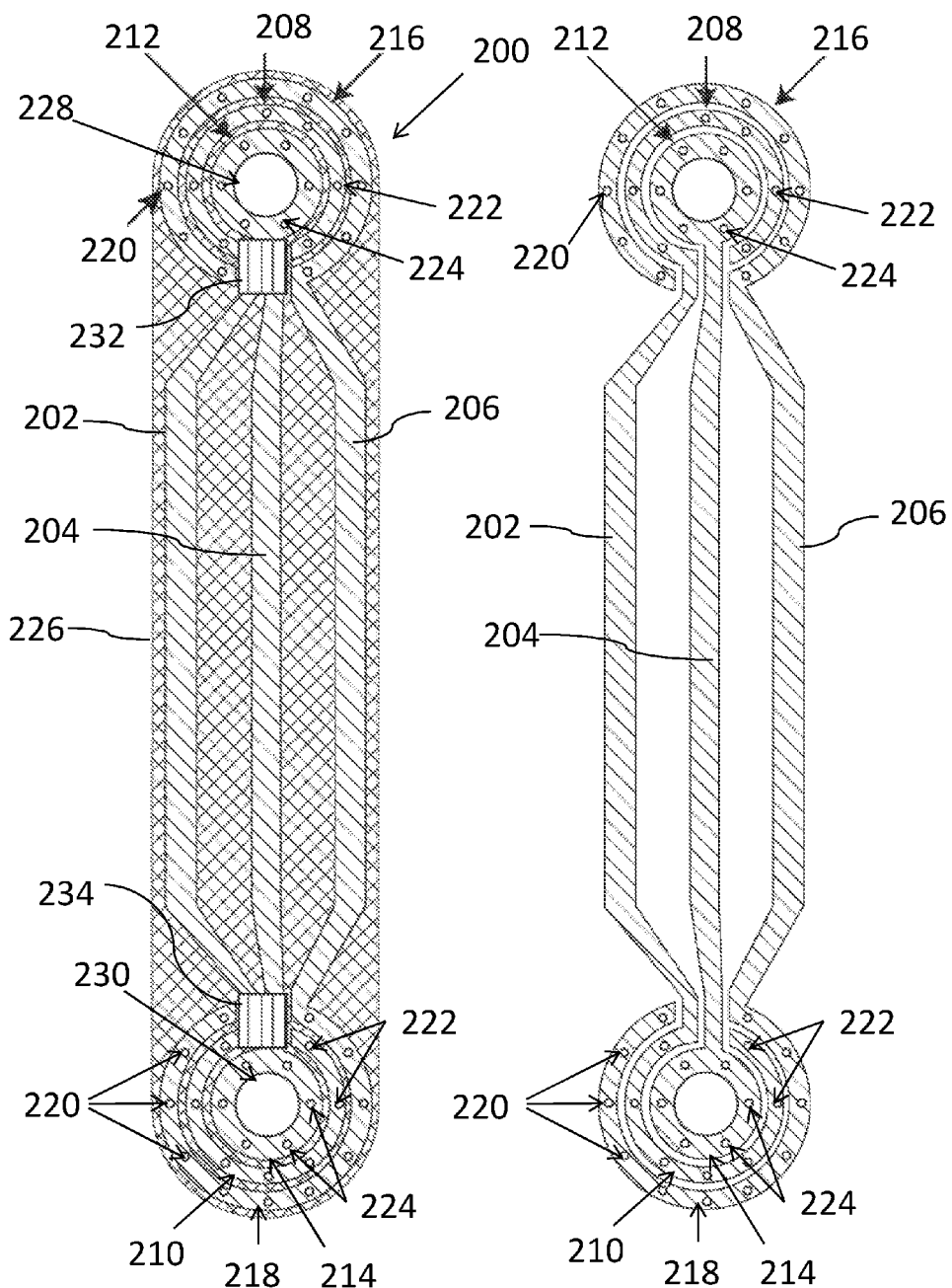
FIG. 2A depicts a printed circuit board module, according to an embodiment.
FIG. 2B depicts a conductive region as applied to a printed circuit board module, according to an embodiment.

In alternate embodiments, multiple concentric circles may be added to the existing pattern, creating additional electrically isolated conductive regions. For example, as shown in FIG. 2A-2B, PCB module 200 may have three conductive regions 202, 204, 206 instead of two. Thus, each end of PCB module 40 would have three circular traces on each face instead of two. In the embodiment shown in FIG. 2A, conductive region 202 may define circular traces 208 and 210; conductive region 204 may define circular traces 212 and 214; and conductive region 206 may define circular traces 216 and 218. It should be noted that it is not necessary that each particular conductive region define the circular trace seen in FIG. 2A. For example, conductive region 204 could form the outer circular, while conductive region 206 could form the inner circular trace. Furthermore, each conductive region does not necessarily have to form the same circular trace on each. For example, conductive region 206 could form the inner circular trace on one end and the outer circular trace on another end.

In the case of three isolated conducting regions, traces from the two inner concentric circular traces 208, 212 and 210, 214 emerge from within the outer conductive regions 216 and 218, respectively, through a gap. This pattern can be continued for many unique, isolated regions. An additional set of vias 220, 222, 224 must be added so that each conductive region 202, 204, 206 will be in electrical connection with a respective conductive region 202', 204', 206' on the opposing side (the opposing side may bear similar or identical corresponding conductive regions, like the opposing side described in conjunction with PCB module 100 and FIGS. 1C-1D). These vias may also be seen, formed through substrate 226, in FIG. 2C—each via corresponding to a conductor that will be added to either side of substrate 60.

PCB module 200 may also define through-holes 228, 230 for receiving a fastener. PCB module 200 may also include solder masks 232, 234 to prevent shorts between circular traces when multiple PCB modules 200 are stacked on top of each other. Solder masks 232, 234 must be at least as wide as the conductive path extending through circular traces 208 and 216.

Figure 2C:
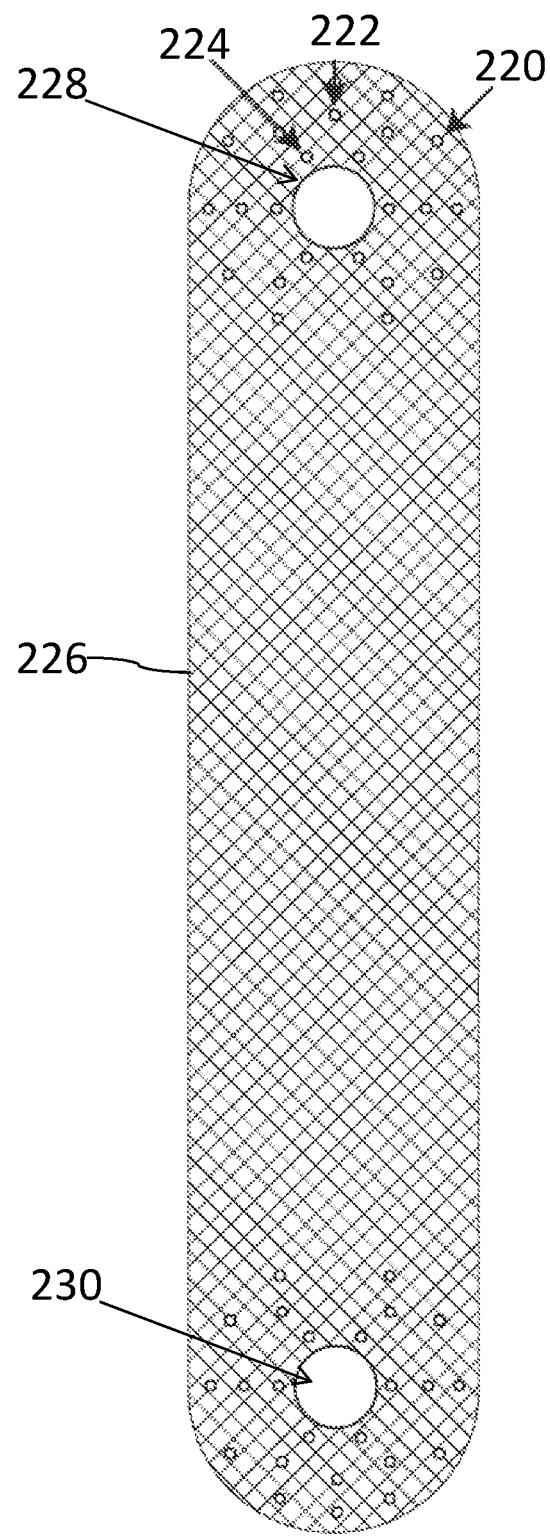
FIG. 2C depicts a substrate of a printed circuit board module, according to an embodiment.

As shown in FIGS. 2A and 2C, substrate 226 may be wider than substrate 102 to accommodate the additional conductive regions of PCB module 200.

One of ordinary skill will appreciate, in conjunction with a review of this disclosure, that any number of conductive regions or concentric circles may be added to accommodate greater numbers of electrical regions to power many types of electrical components mounted or attached to the PCB. Furthermore, it should be understood that all applications of PCB module 100, as described throughout this application, may be implemented using embodiments such as PCB 200 which have more than two conductive regions. Thus, all structures and stacked configurations depicted in FIGS. 3-7 may be implemented using PCB module 200 or PCB modules have even greater numbers of conductive regions.

In an alternate embodiment, PCB module 100 may have only a single conductive region. This may be used to create a ring of PCB conductors that form a single series circuit. Coupling multiple boards in this fashion yields a series circuit with the components on each PCB utilizing a portion of an overall electrical potential. For example, 6 PCBs with 1 LED and 1 resistor on each board, could each have a forward voltage of 4 VDC, and draw power from a 24 VDC power supply if connected in a hexagonal arrangement.

As shown in FIG. 3A, when two or more PCB modules 100 with matching (or at least similar) conductive regions are mechanically joined with their sets of circular traces in contact with one another, the conductive regions from each PCB module 100 are electrically coupled by physically touching one another. Thus, conductive region 104 on one board connects to conductive region 104' on the adjacent stacked board, and conductive region 106 connects to conductive region 106' on the adjacent stacked board. To form a connection, each PCB module 100 must include substantially equally sized concentric circular exposed traces and those traces must be aligned between PCB modules when they are pressed together so that the circular traces (and by extension, conductive regions) on one PCB module 100 lay on top of conductive regions of another PCB module 100 without conductive region 104 of on one board contacting the conductive region 106' on the other board and or conductive region 106 of one board touching conductive region 104' of the other board. A pair of hardware fasteners, such as a screw 302 and nut 304, can be used to hold the PCBs against each other mechanically and preserve their alignment. Fastener 302 can extend through the through-hole 126 (or through-hole 128) defined in the end of PCB module 100 (or elsewhere in PCB module 100 in alternate embodiments).

This allows for the creation of circuits in which multiple individual PCB modules share electrical regions, while maintaining electrical and physical isolation between conductive regions. Additionally, PCBs with the described concentric circular trace shape can rotate positionally around the axis located in the center of their respective sets of concentric circles while remaining electrically coupled with one another and maintaining electrical isolation between regions.

Figure 3B:
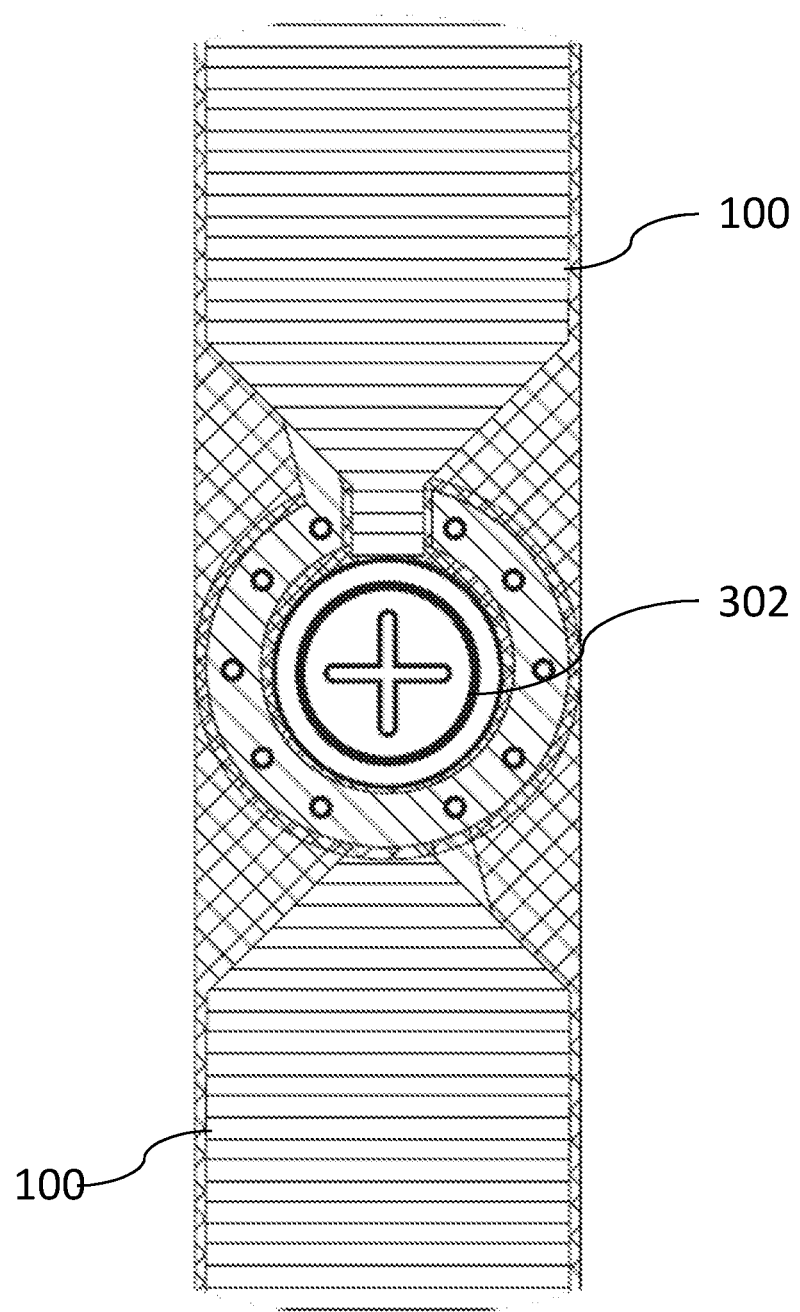
FIG. 3B depicts stacked printed circuit board modules, according to an embodiment.
Figure 3C:
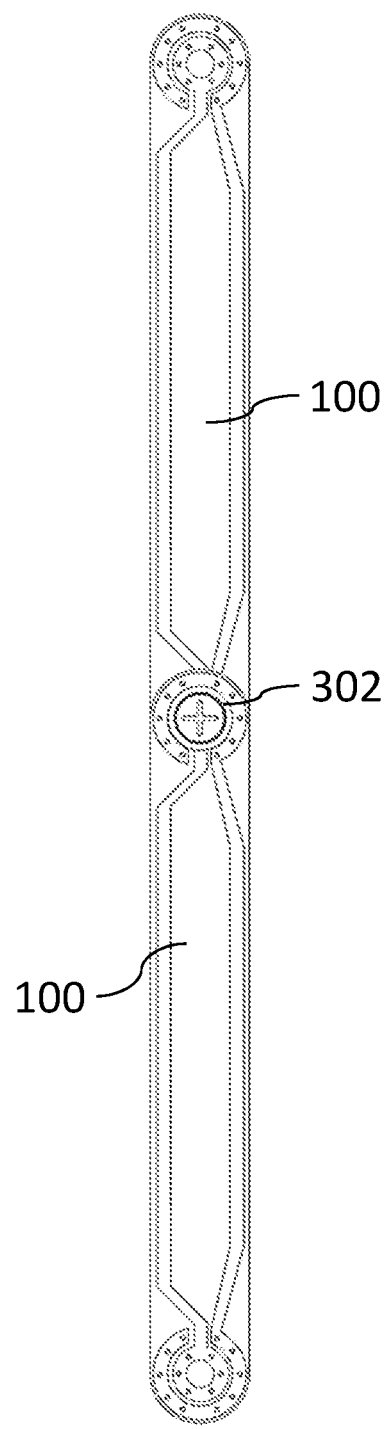
FIG. 3C depicts stacked printed circuit board modules, according to an embodiment.

FIGS. 3B and 3C show alternate views of the stacked configuration depicted in FIG. 3A. FIG. 3B depicts a top-view of stacked PCB modules 100, showing a close-up of the overlapping regions. FIG. 3C is a top view of the entirety of both PCB modules 100, connected together.

Figure 4B:
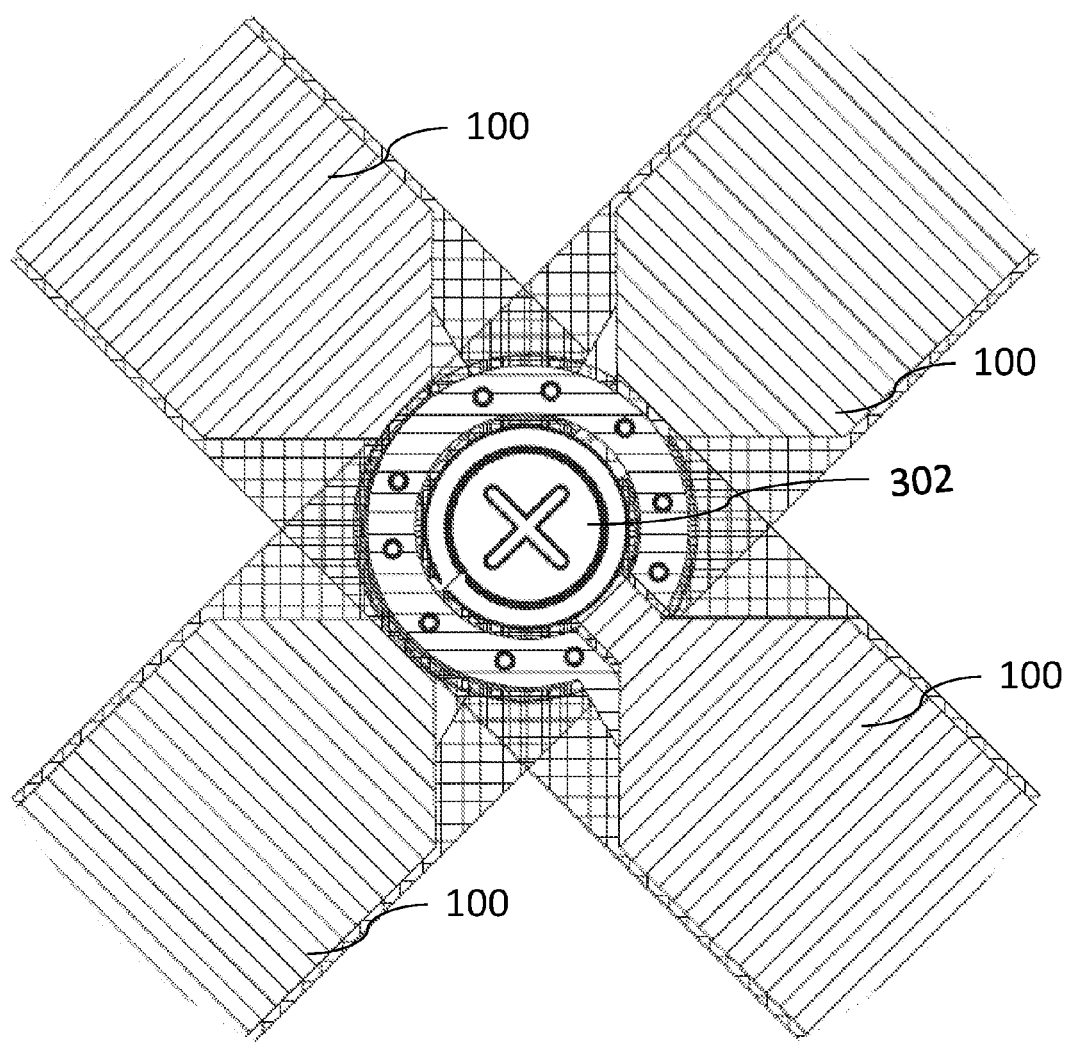
FIG. 4B depicts stacked printed circuit board modules, according to an embodiment.
Figure 4C:
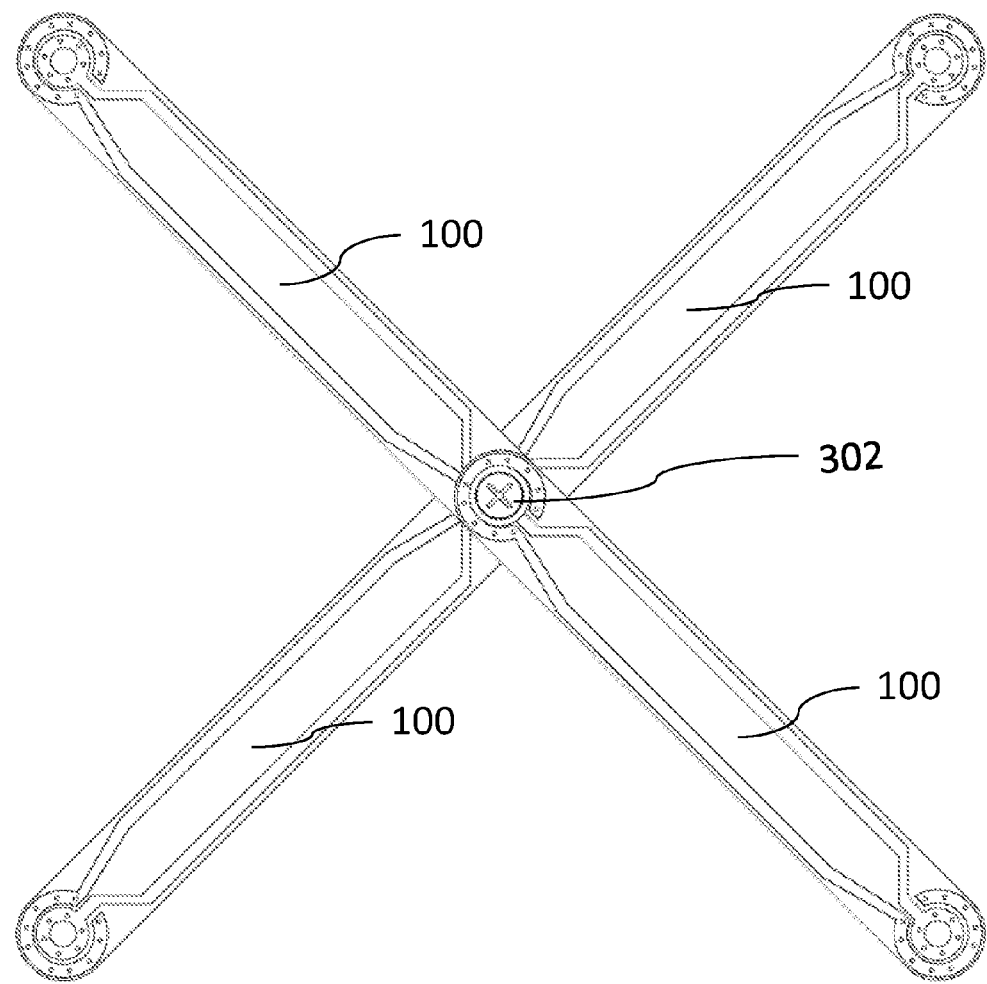
FIG. 4C depicts stacked printed circuit board modules, according to an embodiment.

Again, two or more PCB modules may be coupled together by pressing the circular traces (and, thus, conductive regions) from one PCB module against another. It is possible to stack many PCBs modules 100 in this fashion thus sharing many electrical regions between them. For example, as shown in FIGS. 4A-4C, four PCB modules 100 may be stacked one on top of the other. Because circular traces of each PCB module 100 aligns with circular traces of at least one other stacked adjacent PCB module 100 an electric potential may be communicated between PCB modules 100. Thus, conductive region 104, 104' of each PCB module 100 shares an electric potential with each conductive region 104, 104' of each other stacked PCB module 100. Similarly, conductive region 106, 106' of each PCB module 100 shares an electric potential with each conductive region 106, 106' of each other stacked PCB module. This may extend to any number of conductive regions possessed by the stacked PCB modules. For example, for a PCB module 200 (such as shown in FIG. 2A) that has three conductive regions 202, 204, 206, an electric potential may be shared between each respective region between stacked PCB modules 200. Thus, for example, conductive region 204, 204' (204' being the corresponding conductive region on the opposing side) may share an electric potential with all other conductive regions 204, 204' on all other stacked PCBs. (It should be recognized that the contact between the conductive regions is occurring as a result of contact between the circular traces of identical or similar PCB modules 100. The circular traces are the portions of the conductive regions used to form the connection between the circuit boards.)

FIGS. 4B and 4C show alternate views of the stacked configuration depicted in FIG. 4A. FIG. 4B depicts a top-view of stacked PCB modules 100, showing a close-up of the overlapping regions. FIG. 4C is a top view of the entirety of all four PCB modules 100, connected together.

To create an effective electrical connection, the conductive regions described herein can be made with copper and then plated with gold. The gold plating prevents the conductive region surface from oxidizing, while allowing for a more conductive surface. Furthermore, the softness of gold increases the shared surface area on a molecular scale between conductive regions on one PCB and another. While this inventor has used gold plating, other similarly oxidation-resistant surface finishes could be used.

According to an embodiment, each circular traces has a width greater than 1 mm. Circular traces having widths greater than 1 mm are beneficial for creating reliable electrical connections between traces on physically coupled PCB modules 100. However, traces of any size may be used, as long as they create an electrical connection between the PCB modules 100. Dielectric paste may also be used cover exposed traces and prevent oxidation of PCB module 100's surface, allowing for increased electrical reliability.

The addition of a non-conductive washer to the hardware also allows for some springing action to maintain surface area in spite of mechanical variability (vibration), keeping the circular traces in physical contact with one another.

According to alternate embodiments, PCB modules 100 may be joined using various mechanical fasteners.

As shown in FIGS. 3A and 4A, through-hole 126 (or 128) passing through the PCB module 100 in the center of circular traces 108, 112 (or alternately, 110, 114) allows for a screw or bolt 302 to pass through two or more PCB modules 100 with a nut 304 on its other end so as to press the PCB modules 100 together. Multiple PCBs can be fastened together in this way, creating friction between them and pressing their circular traces into contact with one another while allowing the PCB modules 100 to rotate around the screw or bolt 302, depending on the amount of force applied and the tightness of the nut. In an alternate embodiment, Barrel Screws (also known as Chicago Screws or Binding Posts) could be used instead of a machine screw and a nut. Washers 306 and 308 may be disposed between the screw head and PCB module 100 or between the nut 304 and PCB module 100. Spring-style lock washers can be used on the faces of the outer-most boards on the stack to create a mechanical coupling that responds dynamically to forces applied to the connection. Adding a locknut in combination with a spring washer will create a connection that can rotate without loosening during movement while maintaining consistent electrical contact. Note that a metallic washer needs to be separated from the surface of the PCB module 100 with a dielectric or other insulating spacer to prevent a short between the exposed circular traces on the face of the PCB. For example, dielectric nylon washer can be used to provide some springiness and small amount of give within the connection. The nylon washers also function as an insulator between the screw or fastener and the circular traces.

In an alternate embodiment, a rivet could also be used in place of a screw and a nut. Solder could be used instead of a mechanical fastener. Alternatively, a clip fitting around the outsides of the PCBs could also be used to attach them mechanically. This could negate the need for a through-hole at the ends of the PCB.

In yet another embodiment, two or more PCB modules 100 may be mechanically connected via magnets. Positioning magnets with attracting regions on the far sides of two or more PCB module 100 would pull them into contact with one another, creating a mechanical and electrical connection that would allow for rotation with varying amounts of friction determined by the thickness of the PCB module 100, the number of PCB module 100 and the strength of the magnets. This connection style also has the benefit of being easily removable. The magnetic pair would be physically restrained from leaving the center of rotation by a shaft, indentation in the PCB module 100, or by another physical part that passes through the holes in each PCB module 100. The magnetic pair could also be glued to the surface of the boards or embedded in a plastic part coupled to the surface of the PCB modules 100.

The electrical connection design described herein allows for the creation of both two and three-dimensional geometries made with multiple PCBs. As mentioned above, PCBs utilizing this design can be shaped liked elongated rectangles with rounded ends (as shown in FIGS. 1 and 2) but can also be shaped as asterisks with similar rounded ends featuring concentric circles and holes as shown in the drawing, or triangles with its vertices including circular traces. The stadium shown in FIGS. 1-7 is a simple manifestation of a PCB module design, but the circular traces, conductive regions, and connections described herein may be used independent from the shape or outline of the PCB itself so long as the circular traces from one PCB module matches up with that of another.

PCB modules may be joined to create large planar circuits comprised of multiple PCBs. Each PCB could have light emitting diodes (LEDs), microcontrollers, logic chips, other electrical component and sensors on it. These electrical components may be connected to span the conductive regions bearing different electric potentials. For example, if conductive region 104 is connected to a power source, and conductive region 106 is connected to ground, an electrical component may span both and thus receive power.

Figure 5:
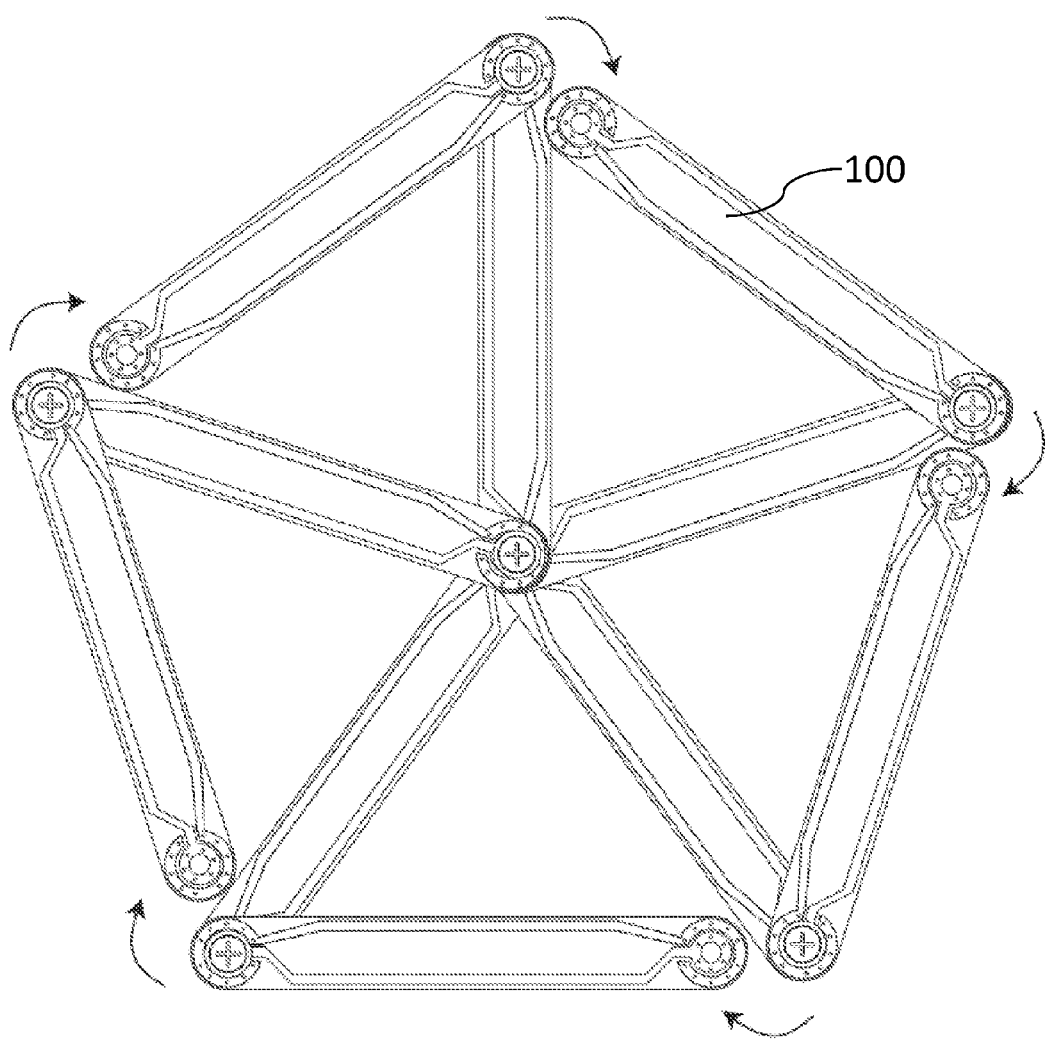
FIG. 5 depicts stacked interconnected printed circuit board modules, according to an embodiment.
Figure 6:
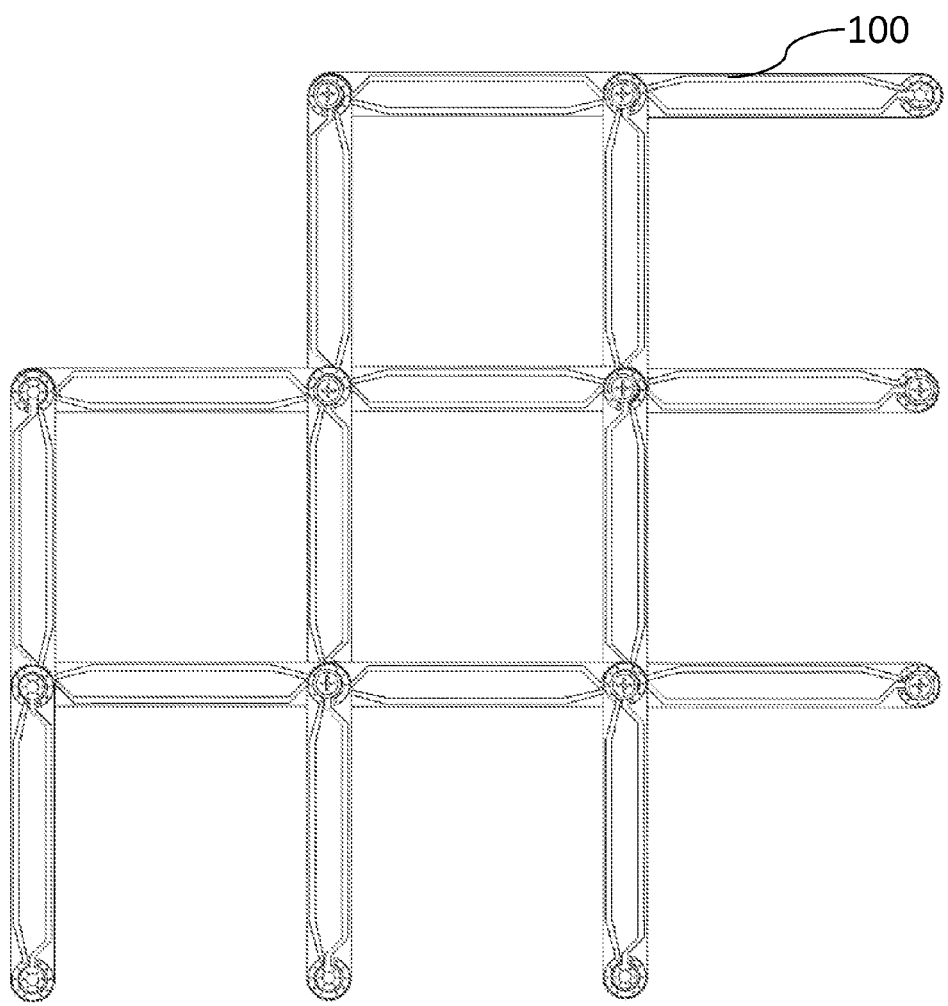
FIG. 6 depicts stacked interconnected printed circuit board modules, according to an embodiment.

A design featuring LEDs could use two conductive regions and could be stacked to make three, four, five, or more sided polygons made up of PCB modules. When connected to each other, the resulting polygons could create a surface, such as shown in FIGS. 5 and 6. The PCB modules would share power with one another through conductive regions 104, 106 and 104', 106' and thus form a parallel circuit. Similarly, with an additional conductive region, such as shown in connection with PCB module 100 in FIG. 2, the PCBs could receive data; enabling color changing LED patterns and addressability (every PCB or LED has its own unique address). This would allow for the display of still or moving images and or text. Of course, a third conductive region is not required to transmit data—for example, data could be instead be modulated over the current or voltage delivered in only two conductive regions, or could instead be delivered wireless via radio-frequency signals.

Thus, the conductive regions could allow for bi-directional communication between PCB modules. The third conductive region could also be employed to create light sources with variable color temperature. For example, two different colors of LEDs could be mounted on each PCB module. The LEDs could share a common power or ground and be turned on and off or modulated in brightness so as to create an overall shifting color output. This would be particularly useful if paired with a controller connected to a user's mobile phone or to the internet. Output colors could be determined via inputs such as time of day, sun or moon cycles, or any other exogenous variable.

Figure 7:
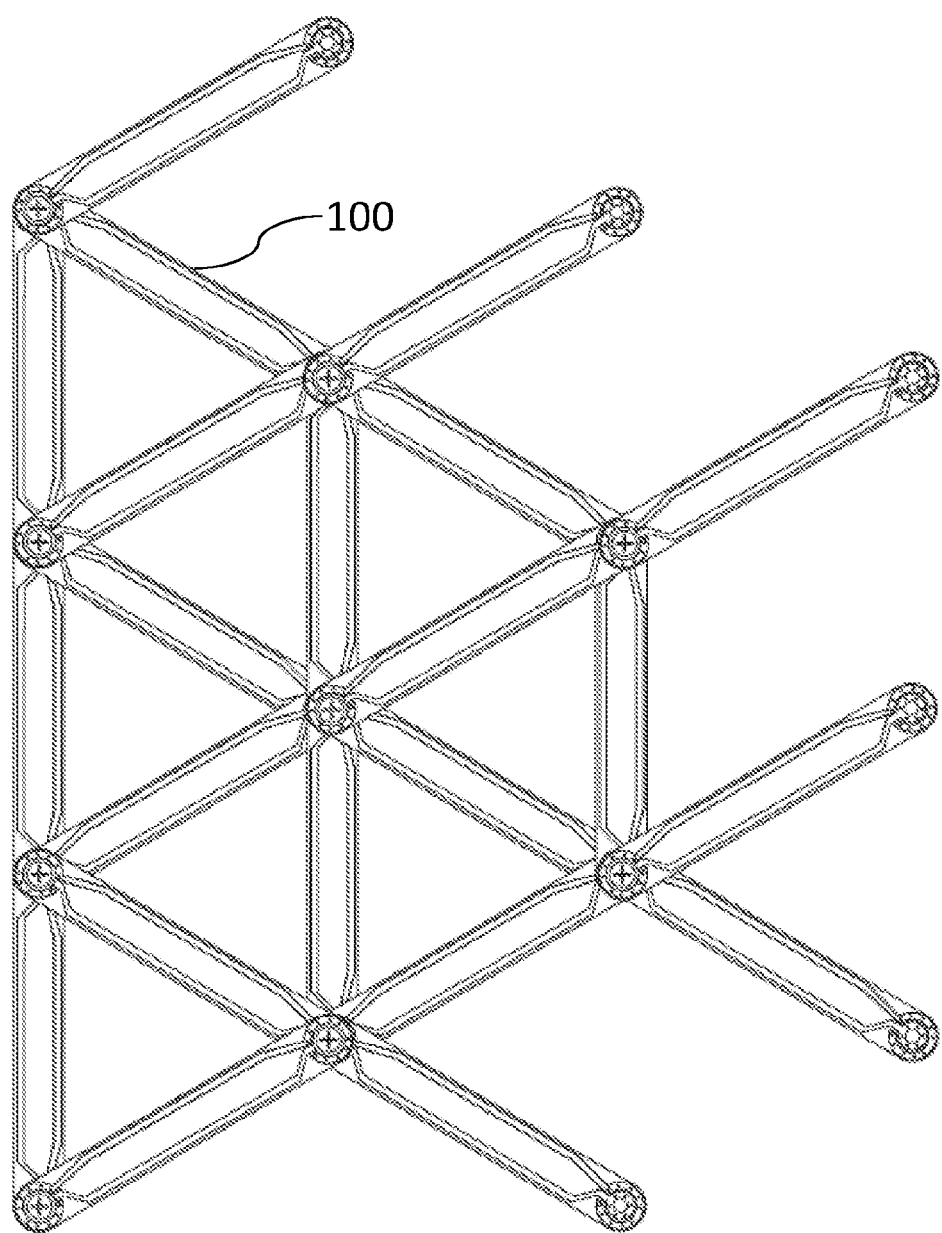
FIG. 7 depicts stacked interconnected printed circuit board modules, according to an embodiment.

PCB module 100 may be made with flexible printed circuit boards, thus allowing for the creation of three-dimensional forms. For example, elongated rectangular PCBs could create a geodesic sphere such as shown in FIG. 7. By making multiple units of three lengths of PCBs, a 3 V geodesic sphere comprised entirely of triangular polygons made up of individual PCB modules could be achieved. The resulting 3-dimensional form would also comprise an electrical circuit with two or more isolated electrical regions, allowing components to receive electricity for power and or data through the PCB structure.

Substrate 100, 200 may be comprised of any material or combination of materials suitable for receiving conductive traces, providing electrical insolation between traces, and withstanding the stresses of connection with other similar printed circuit board modules. For example, substrate 100, 200 may be comprised of fiberglass, but other materials may be used. Substrate 100, 200 may also be rigid or flexible depending on the requirements of different applications.

PCB module 100 is scalable could be made to be quite large (feet in length) and be used to create geodesic structures with multiple mutually exclusive electrical regions contained therein.

PCB module 100 could be connected to a power source according to any suitable way for supplying voltage and current to the appropriate conductive regions. In an embodiment, PCB module 100 could be connected to a power source using a co-axial cable. In an embodiment, the co-axial cable may be rigid and may comprise a pair of nested conductive tubes that are separated with an insulator. The inner tube of the pair of nested conductive tubes may be configured to receive a screw or other fastener. The tubes may be dimensioned such that each tube will terminate in a surface that will respectively contact a conductive ring of PCB module 100 when aligned. Thus, circular traces of PCB module 100 may be respectively placed against the conductive tubes of co-axial connection device and held in place using a fastener that extends through the PCB module 100 and is received by the inner conductive tube. A potential difference applied to the conductive tubes will thus be present on the circular traces and conductive regions of PCB module 100. Such a connective structure may be used to connect PCB module 100 to a power source, or, in an alternate embodiment, to other PCB modules 100. This structure may thus be used to scale structures of interconnected PCB modules in different directions—different PCB modules being held apart from each and electrically connected using the co-axial connection device.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A circuit board, comprising: a substrate having a first surface and an opposing second surface; a first circular trace being conductive and disposed on the first surface of the substrate; a second circular trace being conductive and disposed on the first surface of the substrate, wherein the first circular trace and the second circular trace are arranged concentrically and are electrically insulated from each other; a third circular trace being conductive and disposed on the second surface of the substrate, a first via extending through the substrate and contacting the first circular trace and the third circular trace such that an electrical connection is formed between the first circular trace and the third circular trace; a fourth circular trace being conductive and disposed on the second surface of the substrate, wherein the third circular trace and the fourth circular trace are arranged concentrically and are electrically insulated from each other; a second via extending through the substrate and being in electrical contact with the second circular trace and the fourth circular trace, wherein the third circular trace and the fourth circular trace are arranged opposite the first circular trace and the second circular trace, respectively, wherein the substrate defines a through-hole extending through the substrate and sized to receive a fastener, wherein the through-hole is located in the center of the first circular trace, the second circular trace, the third circular trace, and the fourth circular trace.

2. The circuit board of claim 1, further comprising a fastener extending through the through-hole defined by the substrate.

3. The circuit board of claim 2, further comprising a nylon washer held against the first surface of the substrate by the fastener.

4. The circuit board of claim 2, further comprising a spring washer held against the first surface of the substrate by the fastener.

5. The circuit board of claim 4, wherein either the first conductive path or the second conductive path interrupts the outer circular trace of the first circular trace and the second circular trace such that it forms a continuous conductive path.

6. The circuit board of claim 1, wherein the substrate defines an indentation sized to receive a magnet, wherein the indentation is located in the center of the first circular trace, the second circular trace, the third circular trace, and the fourth circular trace.

7. The circuit board of claim 1, further comprising:
a fifth circular trace being conductive and arranged in a concentric configuration with the first circular trace and the second circular trace;
a sixth circular trace being conductive and arranged in a concentric configuration with the third circular trace and the fourth circular trace.

8. The circuit board of claim 1, further comprising:
a fifth circular trace being conductive and disposed on a second end of the first surface,
a sixth circular trace being conductive and disposed on a second end of the first surface and arranged concentrically with fifth circular trace, wherein the fifth circular trace and the sixth circular trace are electrically insulated from each other.

9. The circuit board of claim 8, wherein the first circular trace and the fifth circular trace are connected by a first conductive path, wherein the fourth circular trace and the sixth circular trace are connected by a second conductive path.

10. The circuit board of claim 8, wherein the first circular trace is electrical communication with a power source such that the first circular trace, the third circular trace, and the fifth circular traces each receive a charge.

11. A network of interconnected circuit boards, comprising: A plurality of circuit boards, each circuit board including: a substrate having a first surface and an opposing second surface; a first circular trace being conductive and disposed on the first surface of the substrate; a second circular trace being conductive and disposed on the first surface of the substrate, wherein the first circular trace and the second circular trace are arranged concentrically and are electrically insulated from each other, wherein the first circular trace and the second circular trace of a first circuit board of the plurality of circuit boards are in electrical contact with the first circular trace and the second circular trace, respectively, of a second circuit board of the plurality of circuit boards, wherein the first circuit board, further comprises: a third circular trace being conductive and disposed on the second surface of the substrate, a first via extending through the substrate and contacting the first circular trace and the third circular trace such that an electrical connection is formed between the first circular trace and the third circular trace; a fourth circular trace being conductive and disposed on the second surface of the substrate, wherein the fourth circular trace and the second circular trace are arranged concentrically and are electrically insulated from each other; a second via extending through the substrate and being in electrical contact with the second circular trace and the fourth circular trace, wherein the third circular trace and the fourth circular trace are arranged opposite the first circular trace and the second circular trace, respectively.

12. The network of interconnected circuit boards of claim 11, wherein the first circular trace and the second circular trace of a third circuit board of the plurality of circuit boards are in electrical contact with the third circular trace and the fourth circular trace, respectively, of the first circuit board of the plurality of circuit boards.

13. The network of interconnected circuit boards of claim 12, wherein each circuit board defines a through-hole located in the center of the first circular trace and the second circular trace, wherein a fastening element extends through the through-hole each of the first circuit board and the second circuit board.

14. The network of interconnected circuit boards of claim 13, wherein the fastening elements include one or more nylon washers that frictively engages a surface of the fastening element and either the first surface or the second surface of one of the first circuit board or the second circuit board.

15. The network of interconnected circuit boards of claim 13, wherein the fastening elements include one or more spring washers that maintain pressure on a surface of the fastening element and either the first surface or the second surface of one of the first circuit board or the second circuit board.

16. The network of interconnected circuit board of claim 11, wherein at least one circuit board of the plurality of circuit boards includes a light emitting diode in electrical contact with and powered by the first circular trace and the second circular trace.

17. The network of interconnected circuit boards of claim 11, wherein each circuit board of the plurality of circuit boards further includes a third circular trace disposed at a second end of each printed circuit board.

18. The network of interconnected circuit boards of claim 17, wherein the third circular trace is connected to the first circular trace by a conductive path.

* * * * *